(12) United States Patent
Shin

(10) Patent No.: US 10,282,492 B2
(45) Date of Patent: May 7, 2019

(54) STRUCTURE EARTHQUAKE-RESISTANCE DESIGN METHOD AND SYSTEM FOR EARTHQUAKE-RESISTANCE MAGNITUDE CALCULATION

(71) Applicant: BUILDING MAGNITUDE TECHNOLOGY ANALYSIS AND RESEARCH SERVICE CO., LTD., Chungcheongbuk-do (KR)

(72) Inventor: Dong Youl Shin, Chungcheongbuk-do (KR)

(73) Assignee: BUILDING MAGNITUDE TECHNOLOGY ANALYSIS AND RESEARCH SERVICE CO., LTD., Cheongju-si, Chungcheongbuk-Do (KR)

( * ) Notice: Subject to any disclaimer, the term of this patent is extended or adjusted under 35 U.S.C. 154(b) by 378 days.

(21) Appl. No.: 15/125,707

(22) PCT Filed: Oct. 8, 2015

(86) PCT No.: PCT/KR2015/010633
§ 371 (c)(1),
(2) Date: Sep. 13, 2016

(87) PCT Pub. No.: WO2016/064117
PCT Pub. Date: Apr. 28, 2016

(65) Prior Publication Data
US 2016/0378886 A1    Dec. 29, 2016

(30) Foreign Application Priority Data
Oct. 25, 2014  (KR) .................. 10-2014-0145601

(51) Int. Cl.
G06F 7/48         (2006.01)
G06F 17/50        (2006.01)
G06Q 50/08        (2012.01)

(52) U.S. Cl.
CPC ......... *G06F 17/5004* (2013.01); *G06Q 50/08* (2013.01)

(58) Field of Classification Search
CPC ....................................................... G06F 17/50
(Continued)

(56) References Cited

U.S. PATENT DOCUMENTS 4,910,929 A * 3/1990 Scholl ................ E04B 1/24
                                                  52/167.3
2003/0177834 A1* 9/2003 Kazama ............... G01N 29/12
                                                   73/649

FOREIGN PATENT DOCUMENTS

JP    2003-147970 A    5/2003
JP    2003-240671 A    8/2003
(Continued)

OTHER PUBLICATIONS

K. B. Olsen, Three-Dimensional Dynamic Simulation of the 1992 Landers Earthquake (Year: 1997).*
(Continued)

*Primary Examiner* — Lechi Truong
(74) *Attorney, Agent, or Firm* — Paratus Law Group, PLLC

(57) ABSTRACT

The structure earthquake-resistance design method may include an earthquake-resistance calculation using the structure design data; a required ground acceleration calculation wherein at the required ground acceleration, the earthquake-resistance matches the external vibration-force; and an earthquake magnitude calculation wherein the earthquake magnitude is calculated at a predetermined distance at which the required ground acceleration is available.

4 Claims, 7 Drawing Sheets

(58) Field of Classification Search
USPC .............................................................. 703/6
See application file for complete search history.

(56) References Cited

FOREIGN PATENT DOCUMENTS

| KR | 10-0808817 B1 | 3/2008 |
| KR | 10-0842887 B1 | 7/2008 |
| KR | 2014-0058116 A | 5/2014 |

OTHER PUBLICATIONS

Jan. 19, 2016 International Search Report issued in International Patent Application No. PCT/KR2015/010633.

* cited by examiner

Structural Seismic DATA. I

| hs.1F = | 4.2 | m | | D1 | S120 |

Con'c COMPRESSION STRENGTH: fck = 21 Mpa ---> Ec = 24854 Mpa
FRAMEWORK YIELD STRENGTH: fy = 235 Mpa , Es = 205000 Mpa Col & Wall

| RC | X-Dir, mm | Y-Dir, mm | EA |
|---|---|---|---|
| R1) | 400 | 600 | 18 |
| R2) | 200 | 4000 | 2 |
| R3) | 3000 | 200 | 2 |
| ⋮ | | | |

| ST | H-BEAM | EA | AXIS DIRECTION |
|---|---|---|---|
| S1) | | | |
| S2) | | | |
| S3) | | | |
| ⋮ | | | |

| DAMPING RATE (c) = 5.0 %, SHEAR WAVE VELOCITY = 360m/s  D2 | S160 |

Structural Seismic DATA. II

EARTHQUAKE IMPORTANCE FACTOR (IE)   1.0   D3   — S220

RESISTANCE SYSTEM (X-Dir): INTERMEDIATE MOMENT FRAMEWORK OF STEEL-REINFORCED CONCRETE
(Y-Dir): INTERMEDIATE MOMENT FRAMEWORK OF STEEL-REINFORCED CONCRETE hs.ALL = 12.6 m
EFFECTIVE WEIGHT (We) = 6028 KN

Ground Conditions

| Soil Grade : Sd | D4 |

S231
INITIAL GROUND ACCELERATION ASSUMPTION VALUE (G'): 0.22g

| FOCAL DEPTH : 10 km | — S311 |
| SEISMIC EPICENTER DISTANCE : 100 km | |

S312a

| CORRECTION COEFFICIENT | CD | CA | CM |
|---|---|---|---|
| 1 | 0.84 | 1 | 1.2 |
| 2 | 0.0061 | 980.665 | |
| n | 0 | 0.49 | |

STRUCTURE EARTHQUAKE-RESISTANCE DESIGN METHOD AND SYSTEM FOR EARTHQUAKE-RESISTANCE MAGNITUDE CALCULATION

BACKGROUND

Field of the Present Disclosure

The present disclosure relates to a structure earthquake-resistance design method and system for earthquake-resistance magnitude calculation. More particularly, the present disclosure relates to a structure earthquake-resistance design method and system for earthquake-resistance magnitude calculation wherein the earthquake-resistance magnitude is calculated based on a distance between the structure site and a predetermined location.

Discussion of the Related Art

A conventional earthquake-resistance design method may include a pseudo-static analysis, or dynamic analysis, wherein the latter may include a response spectral analysis or a linear or non-linear time-history analysis. The conventional earthquake-resistance design method may have a following assumption for calculation of an initial earthquake load in an earthquake-resistance design: when an earthquake occurs at a given repetition period, a ground acceleration therefrom has reach a site ground of the structure. Thus, the conventional earthquake-resistance design method may be based only on a time-related occurrence probability of the earthquake. The conventional earthquake-resistance design method may have a following determination in an earthquake-resistance design result check: only when an inter-store displacement is below an acceptable inter-store displacement, it may be safe. Thus, the conventional earthquake-resistance design method may not provide an exact earthquake resistance magnitude of the structure.

SUMMARY

Thus, the present disclosure provides a structure earthquake-resistance design method and system for earthquake-resistance magnitude calculation to provide an exact earthquake resistance magnitude of the structure.

In one aspect of the present disclosure, there is provided a structure earthquake-resistance design method using a computer, the method comprising: receiving first information about a structure at a predetermined site by an input of an interface of the computer and calculating an earthquake-resistance of the structure by a processor of the computer, wherein the first information is related to the earthquake-resistance calculation; receiving second information about the structure and a surrounding gourd characteristic by the input of the interface of the computer, calculating an external vibration force by the processor of the computer, wherein the second information is related to the external vibration force calculation, and calculating a required ground acceleration at which the external vibration force matches the earthquake-resistance by the processor; and calculating, by the processor, an earthquake magnitude at a predetermined distance at which the required ground acceleration is available.

The present structure earthquake-resistance design method and system for earthquake-resistance magnitude calculation may provide an exact earthquake resistance magnitude of the structure.

Thus, using the present structure earthquake-resistance design method and system, the earthquake-resistance design quality may be evaluated, the non-expert may be interested in the earthquake-resistance design result, the constructed building may have a high reliability, the building may be evaluated in terms of earthquake-resistance. Thus, the building buyer may reflect the earthquake-resistance in a reliable manner.

BRIEF DESCRIPTION OF THE DRAWINGS

FIG. 7 shows an exemplary interface input of a system for performing a structure earthquake-resistance design method in accordance with an embodiment of the present disclosure, wherein the method includes an earthquake-resistance magnitude calculation.

DETAILED DESCRIPTIONS

Hereinafter, a structure earthquake-resistance design method including an earthquake-resistance magnitude calculation and a system for performing the method, in accordance with an embodiment of the present disclosure will be described in details with reference to accompanying drawings. Each of steps of the structure earthquake-resistance design method including an earthquake-resistance magnitude calculation may include a corresponding computing operation. Thus, the system for performing the method may include a computing unit for the corresponding computing operation.

Figure 1:
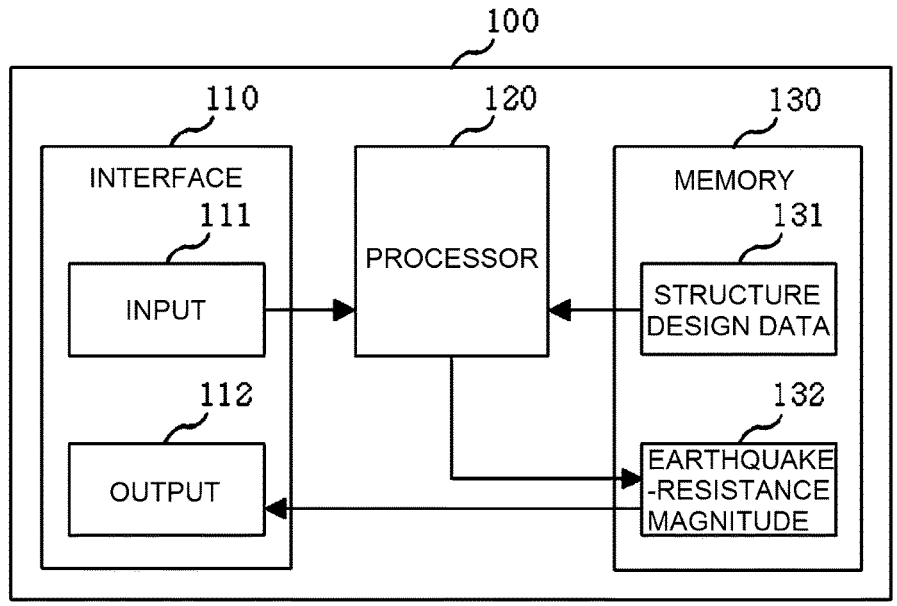
FIG. 1 shows a block diagram of a system for performing a structure earthquake-resistance design method in accordance with an embodiment of the present disclosure.
Figure 2:
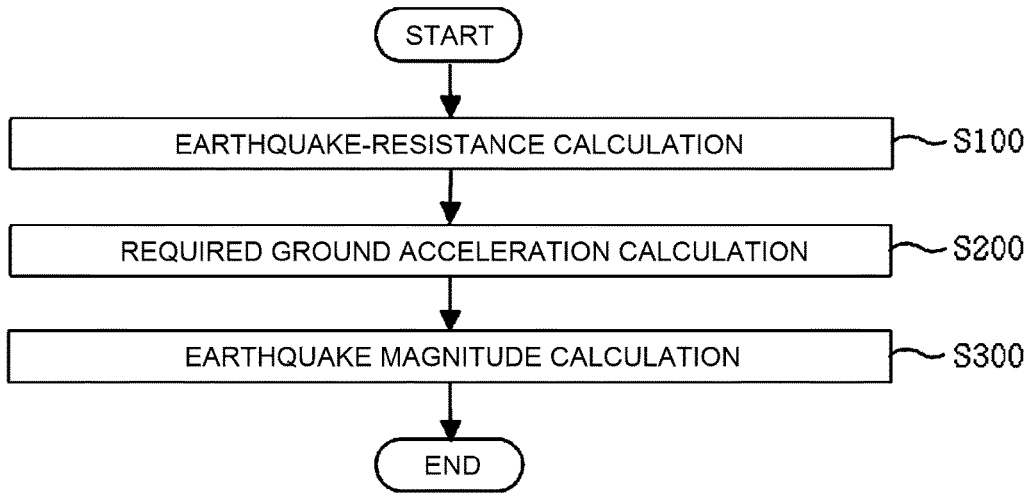
FIG. 2 shows a flow chart of a structure earthquake-resistance design method including an earthquake-resistance magnitude calculation in accordance with an embodiment of the present disclosure.
Figure 3:
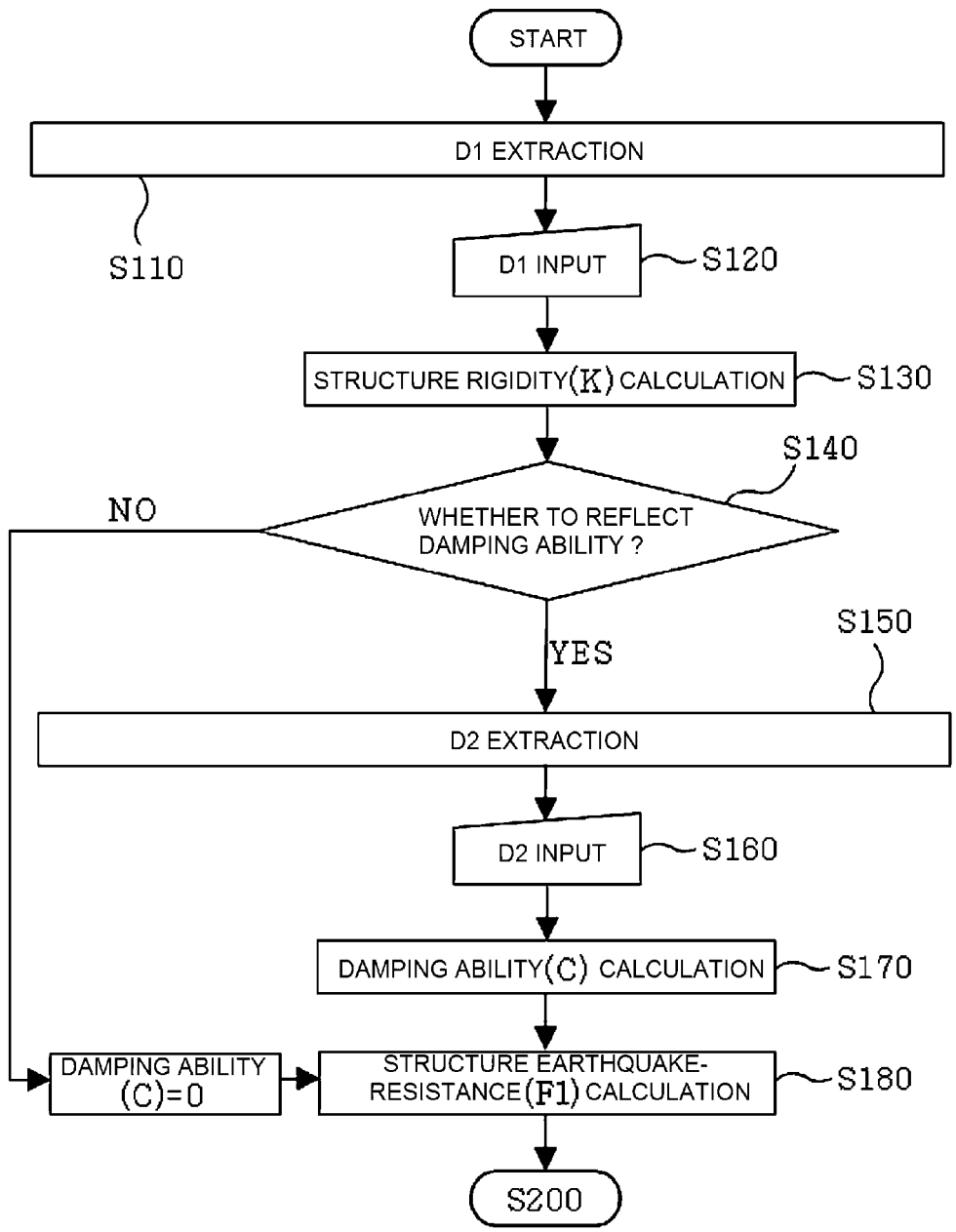
FIG. 3 shows a flow chart of a step of calculating a structure vibration-resistance, as shown in FIG. 2.
Figure 4:
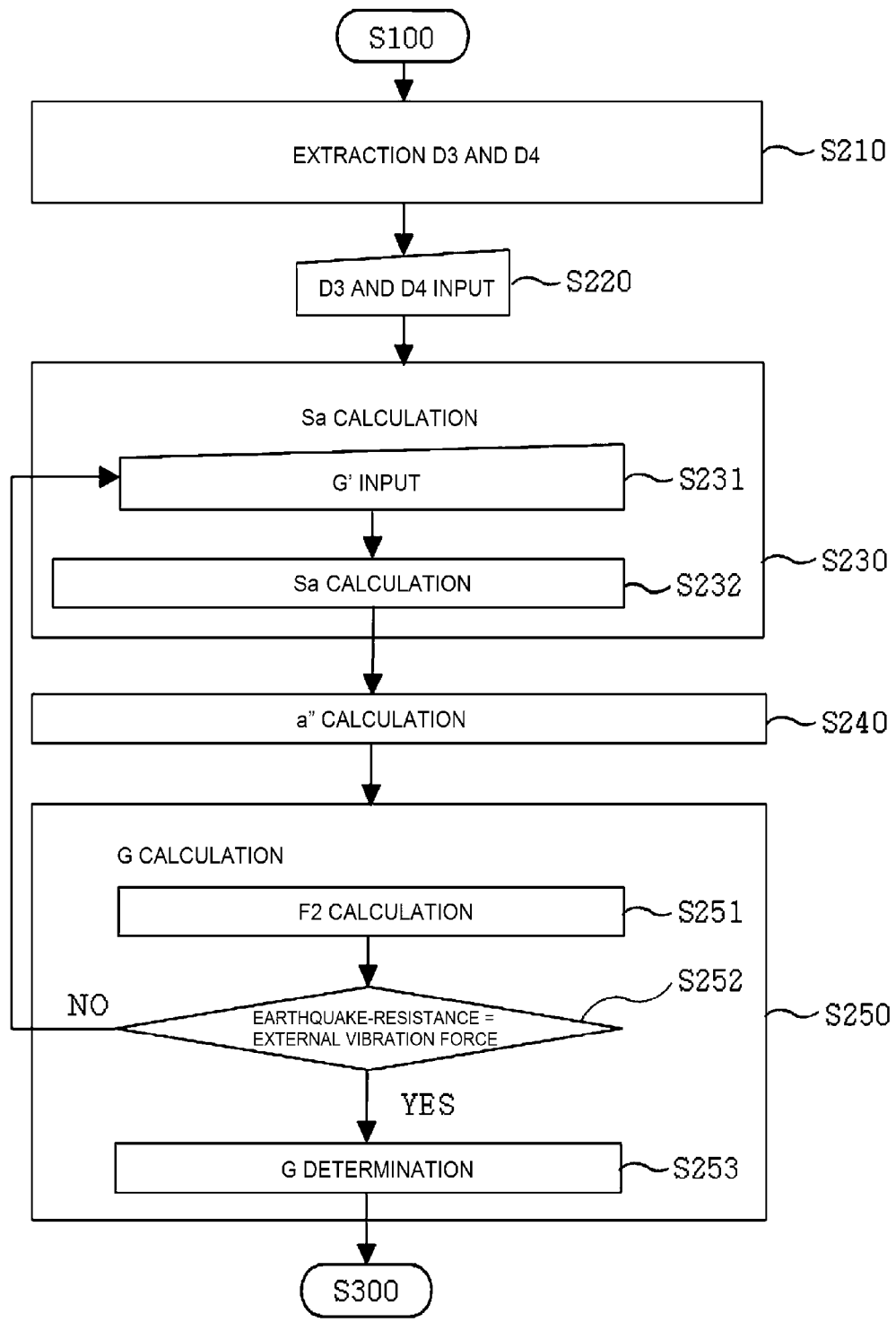
FIG. 4 shows a flow chart of a step of calculating a required ground acceleration at which an earthquake-resistance matches an external vibration-force, as shown in FIG. 2.
Figure 5:
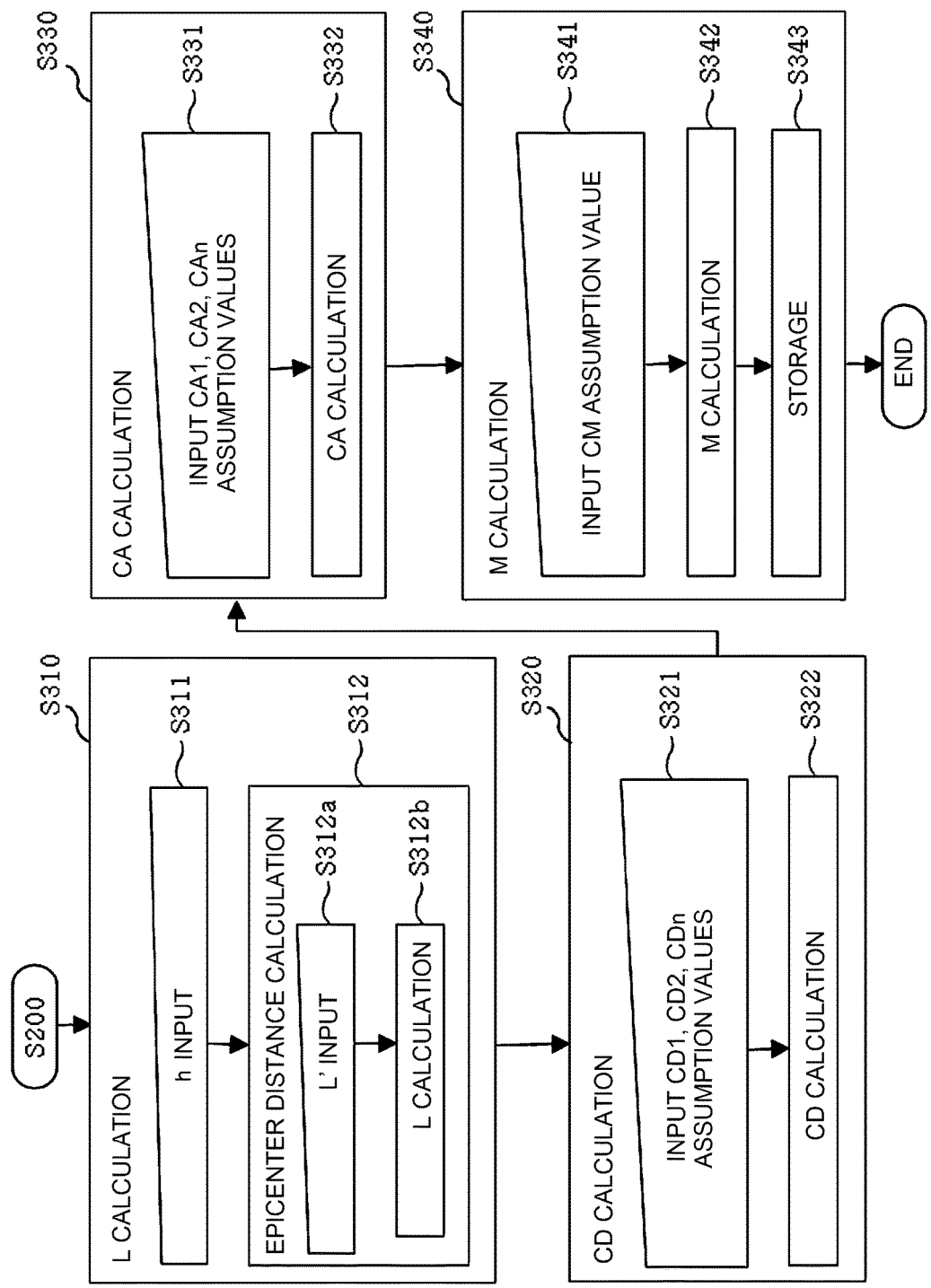
FIG. 5 shows a flow chart of a step of calculating an earthquake magnitude at a predetermined distance at which the required ground acceleration is available, as shown in FIG. 2.
Figure 6:
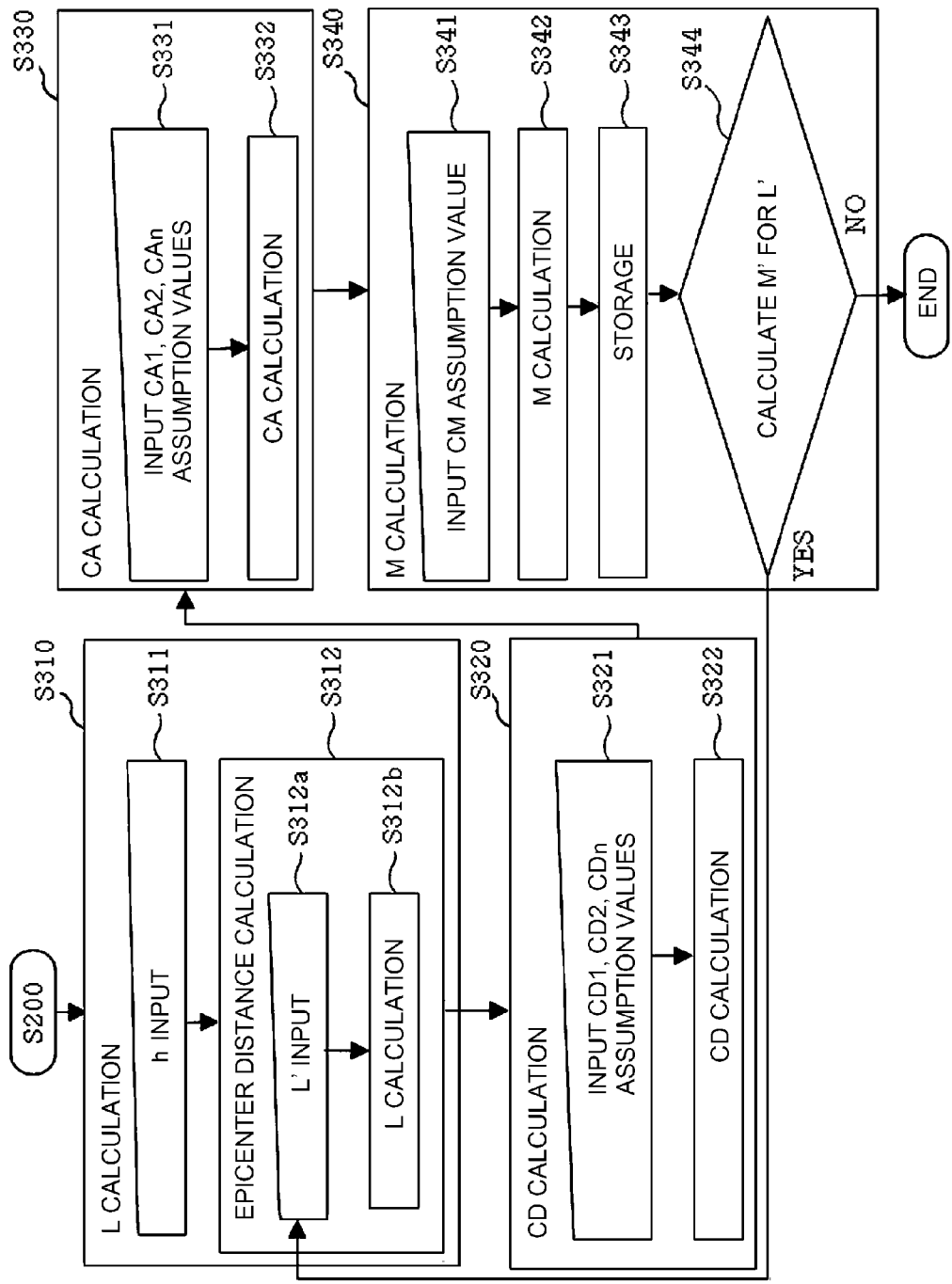
FIG. 6 shows a flow chart of a step of calculating earthquake magnitudes at multiple predetermined distances at which the required ground acceleration is available, as shown in FIG. 2.
Figure 8:
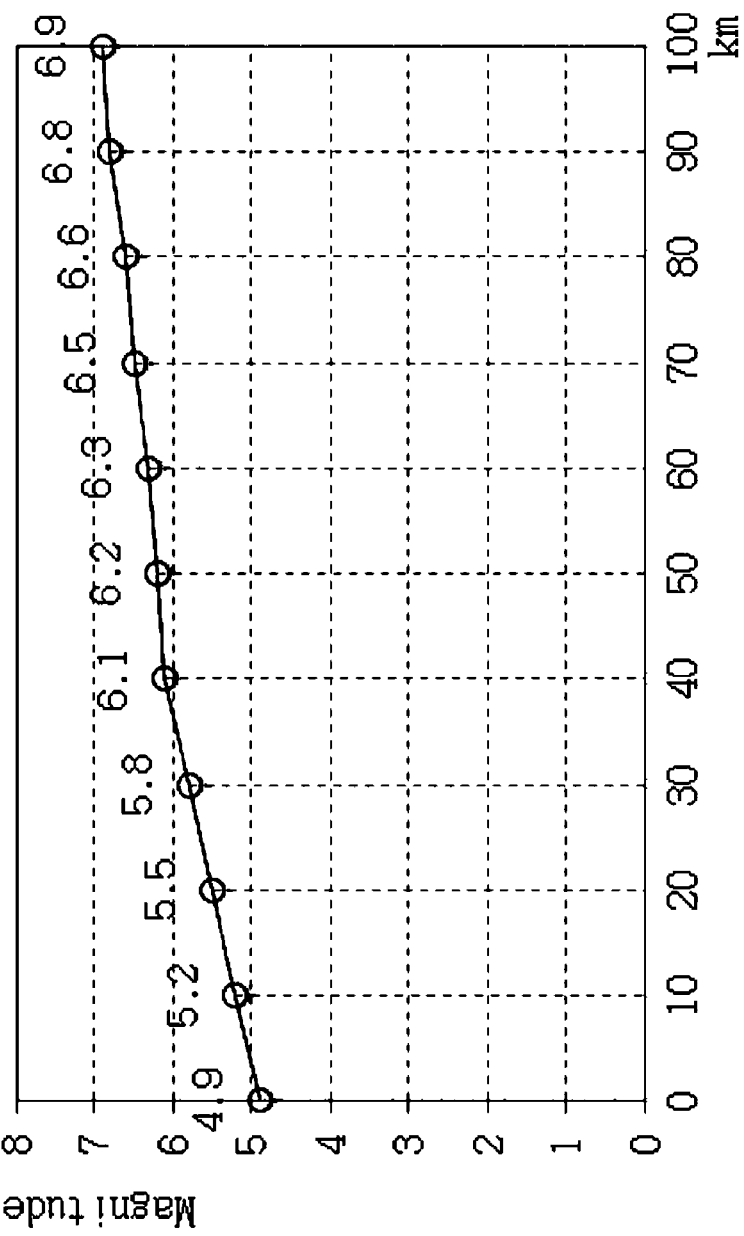
FIG. 8 shows an exemplary interface output of a system for performing a structure earthquake-resistance design method in accordance with an embodiment of the present disclosure, wherein the method includes an earthquake-resistance magnitude calculation.

FIG. 1 shows a block diagram of a system 100 for performing a structure earthquake-resistance design method in accordance with an embodiment of the present disclosure; FIG. 2 shows a flow chart of a structure earthquake-resistance design method including an earthquake-resistance magnitude calculation in accordance with an embodiment of the present disclosure; FIG. 3 shows a flow chart of a step S100 of calculating a structure earthquake-resistance S180, as shown in FIG. 2; FIG. 4 shows a flow chart of a step S200 of calculating a required ground acceleration S253 at which an earthquake-resistance matches an external vibration-force, as shown in FIG. 2; FIG. 5 shows a flow chart of a step of calculating an earthquake magnitude S342 at a predetermined distance S312$b$ at which the required ground acceleration S253 is available, as shown in FIG. 2; FIG. 6 shows a flow chart of a step of calculating earthquake magnitudes at multiple predetermined distances at which the required ground acceleration is available, as shown in FIG. 2; FIG. 7 shows an exemplary input 111 of an interface 110 of the system 100 for performing a structure earthquake-resistance design method in accordance with an embodiment of the present disclosure, wherein the method includes an earthquake-resistance magnitude calculation; and FIG. 8 shows an exemplary output 112 of the interface 110 of the system 100 for performing a structure earthquake-resistance design method in accordance with an embodiment of the present disclosure, wherein the method includes an earthquake-resistance magnitude calculation.

As shown in FIG. 1, a system 100 for performing a structure earthquake-resistance design method in accordance with an embodiment of the present disclosure may include an interface 110, a processor 120 and a memory 130. The interface 110 may include an input 111 and an output 112. The input 111 may receive a structure design data D1 extraction for structure rigidity calculation, and a structure design data D2 extraction for structure damping ability calculation, as shown in FIG. 3; structure design data D3 and surrounding ground characteristic D4 extractions for structure external vibration-force calculation, and a ground acceleration assumption value G', as shown in FIG. 4; a focal depth assumption value h, a seismic epicenter distance assumption value L', ground damping coefficient CD1, CD2, CDn assumption values based on hypocenter distances, correction coefficient CA1, CA2, CAn assumption values based on required ground accelerations G, correction coefficient CM assumption values based on site amplification coefficients due to ground characteristics, as shown in FIG. 5 and FIG. 6. The output 112 may output a resultant earthquake-resistance magnitude M. The processor 120 may calculate a structure rigidity K, a structure damping ability C, and a structure earthquake-resistance F1 as shown in FIG. 3; a structure-designed response spectral acceleration Sa, a required acceleration a", an external vibration-force F2, and a required ground acceleration G as shown in FIG. 4; and a hypocenter distance L, a damping value CD based on the hypocenter distance, a required ground acceleration transformation value CA, and an earthquake-resistance magnitude M as shown in FIG. 5 and FIG. 6. The memory 130 may store therein structure design data 131 for extracting the structure design data D1, D2, D3 and surrounding ground characteristic D4, and the resultant earthquake-resistance magnitude 132.

The structure earthquake-resistance design system 100 as shown in FIG. 1 may perform the structure earthquake-resistance design method including the earthquake-resistance magnitude calculation. As shown in FIG. 2, the structure earthquake-resistance design method may include an earthquake-resistance calculation S100 using the structure design data; a required ground acceleration calculation S200 wherein at the required ground acceleration, the earthquake-resistance matches the external vibration-force; and an earthquake magnitude calculation S300 wherein the earthquake magnitude is calculated at a predetermined distance at which the required ground acceleration is available.

First, the earthquake-resistance calculation S100 using the structure design data will be described in details with reference to FIG. 3. The earthquake-resistance calculation S100 may include an operation S110 of extracting structure design data D1 for structure rigidity calculation; an operation S120 of inputting the structure design data D1; an operation S130 of calculating a structure rigidity K; an operation S140 of determining whether to reflect a structure damping ability; an operation S150 of extracting structure design data D2 for structure damping ability calculation; an operation S160 of inputting the structure design data D2; an operation S170 of calculating the structure damping ability C; and an operation S180 of calculating the structure earthquake-resistance F1. To be more specific, a reference will be made to FIG. 1, FIG. 3 and FIG. 7. In the operation S110, among the structure design data 131, an elastic modulus and size of at least one vertical member of columns and walls, store and height, earthquake importance factor, etc. may be extracted as the structure design data D1 for the rigidity calculation in FIG. 3. Then, the structure design data D1 may be inputted to the input 111 of the interface 110 as shown in FIG. 7 (S120). Then, the processor 120 as shown in FIG. 1 may perform the structure rigidity K calculation S130 as shown in FIG. 3 using the data D1. To be specific, the processor 120 as shown in FIG. 1 may calculate the rigidity of the vertical member using the elastic modulus and size of the at least one vertical member of columns and walls, and the store and height, and determine a structure earthquake-resistance grade using the earthquake importance factor, and multiply an acceptable inter-store displacement ratio resulting from the structure earthquake-resistance grade by the store and height to calculate an acceptable inter-store displacement, and multiply the calculated rigidity by the acceptable inter-store displacement to calculate the structure rigidity K. Then, in the operation S140, whether to reflect the structure damping ability may be determined.

When the structure damping rate calculation is not available or when the earthquake-resistance is intended to be calculated as a lower value to an actual value to secure reliable earthquake-resistance design, the structure damping rate 0% may be inputted to the input 111 of the interface 110 (S160). To be more specific, the structure damping rate may be generally set as 1% to 10%. When the structure damping ability is reflected to obtain the earthquake-resistance, among the structure design data 131 in FIG. 1, the structure damping rate (%) and ground shear wave velocity may be extracted as the structure design data D2 for the damping ability calculation as shown in FIG. 3 (S150). Then, the structure design data D2 may be inputted into the input 111 of the interface 110 as shown in FIG. 7 (S160). Then, the processor 120 in FIG. 1 may multiply the damping rate by the ground shear wave velocity to obtain the damping ability C (S170), and may sum the structure rigidity K and structure damping ability C to obtain the structure earthquake-resistance F1.

Next, as shown in FIG. 4, the operation S200 of the required ground acceleration may include an operation S210 of extracting structure design data D3 and surrounding ground characteristics D4 for structure external vibration-force calculation; an operation S220 of inputting the structure design data D3 and surrounding ground characteristics D4 for structure external vibration-force calculation; an operation S230 of calculating a structure-designed response spectral acceleration Sa, wherein the operation S230 may include an operation S231 of inputting a ground acceleration assumption value G', and an operation S232 of calculating the structure-designed response spectral acceleration Sa; an operation S232 of summing the ground acceleration assumption value G' and structure-designed response spectral acceleration Sa to obtain the required acceleration a"; and an operation S250 of calculating a structure required ground acceleration G wherein the operation S250 may include an operation S251 of multiplying the required acceleration a" by the structure effective mass to obtain the external vibration-force F2, and an operation S252 of checking whether the external vibration-force F2 matches the earthquake-resistance F1, and an operation S253 of determining the required ground acceleration G. This will be described in details with reference to FIG. 1, FIG. 4 and FIG. 7. In the operation S210, among the structure design data 131 in FIG. 1, the earthquake importance factor, a height and/or an effective weight of a structure framework earthquake resistance system and a full structure, ground type, etc. may be extracted as the structure design data D3 and surrounding ground characteristic D4 for the structure external vibration-force calculation as shown in FIG. 4. Then, the structure design data D3 and surrounding ground characteristic D4 may be input to the input 111 of the interface 110 (S220). Then, for the structure-designed response spectral acceleration Sa calculation, the ground acceleration assumption value G' may be input to the input 111 of the interface 110 (S231) as shown in FIG. 7 and, then, the processor 120 in FIG. 1 may calculate a natural period and short period and one-second period response spectrums of the structure corresponding to the ground acceleration assumption value G'. The processor may use the calculated natural period and short period and one-second period response spectrums to yield the structure-designed response spectral acceleration Sa (S232). The processor may sum the ground acceleration assumption value G' and the calculated structure-designed response spectral acceleration Sa to obtain the required acceleration a" (S240). The processor may multiply the required acceleration a" by the effective weight among the structure design data D3 to obtain an inertial force as the external vibration-force F2 (S251). The processor may determine whether the external vibration-force F2 matches the earthquake-resistance F1 (S252). Upon determination that the external vibration-force F2 does not match the earthquake-resistance F1, a calculation may be repeated until a difference therebetween reaches "0". Upon determination that the external vibration-force F2 matches the earthquake-resistance F1, the required ground acceleration G may be determined (S253).

Next, the earthquake magnitude calculation operation S300 will be described. As shown in FIG. 5 and FIG. 6, the earthquake magnitude calculation operation S300 may include an operation S310 of calculating a distance L between the hypocenter and structure provided that the earthquake occurs, wherein the operation S310 include an operation S311 of inputting a focal depth assumption value h, an operation S312a of inputting a seismic epicenter distance assumption value L', and a hypocenter distance calculation operation S312 of calculating a hypocenter distance L; an operation S321 of inputting the ground damping coefficient CD1, CD2, CDn assumption values based on the hypocenter distances L; an operation S322 of calculating a damping value CD based on the hypocenter distance L; an operation S330 of calculating a required ground acceleration transformation value CA, wherein the operation S330 includes an operation S331 of correction coefficient CA1, CA2, CAn assumption values based on required ground accelerations G, and an operation S332 of calculating a required ground acceleration transformation value CA at the structure site; and an operation 340 including an operation S341 of inputting a correction coefficient assumption value CM reflecting ground amplifications base on the ground characteristic, an operation S342 of calculating an earthquake magnitude M and an operation S343 of storing the calculated earthquake magnitude M. Optionally, as show in FIG. 6, the earthquake magnitude calculation operation S300 may further include an operation S344 of determining whether a further earthquake-resistance magnitude M' is calculated for a further hypocenter distance L'. This will be described in details with reference to FIG. 1, FIG. 5, FIG. 6, FIG. 7, and FIG. 8. For the calculation operation of the distance L between the hypocenter and structure site provided that the earthquake occurs, the focal depth assumption value h and seismic epicenter distance assumption value L' may be inputted to the input 111 of the interface 110 as shown in FIG. 7 (S311, S312a), and the processor 120 in FIG. 1 may calculate the hypocenter distance L, and may set damping coefficients CD1, CD2, CDn based on the calculated hypocenter distances L. Then, the damping coefficients CD1, CD2, CDn may be inputted to the input 111 of the interface 110 as shown in FIG. 7 (S321). The processor 120 in FIG. 1 may calculate a damping value CD based on the hypocenter distance S322. In this connection, the damping value CD calculation based on the hypocenter distance may be conducted as follows:

$$CD=CD1*\ln(L)+CD2*L+CDn \qquad \text{equation (1)}$$

where, L refers to the hypocenter distance (km unit), ln(L) refers to a natural logarithm value for the hypocenter distance L, CD1 refers to the damping coefficient for the hypocenter distance, CD2 refers to the damping coefficient for the hypocenter distance natural logarithm value, and CDn refers to a further correction damping coefficient.

Further, the correction coefficients CA1, CA2, CAn based on the calculated required ground accelerations G may be inputted to the input 111 of the interface 110 as shown in FIG. 7 (S331). Then, the processor 120 may calculate the required ground acceleration transformation value CA using the correction coefficients CA1, CA2, CAn as follows:

$$CA=[\ln(CA1*A)-CA2]/CAn \qquad \text{equation 2}$$

where, A refers to the calculated required ground acceleration (gravitational acceleration unit g), CA1 refers to an unit correction coefficient for transformation of the required ground acceleration g to cm/s$^2$ unit (about 980 or more precisely 980.665), CA2 and CAn refer to correction coefficients for transformation of the unit-transformed required ground acceleration natural logarithm value to an earthquake magnitude at the structure site.

Furthermore, the correction coefficient CM assumption value reflecting ground amplification based on the ground characteristic may be inputted to the input 111 of the interface 110 as shown in FIG. 7 (S341). The processor 120 in FIG. 1 may calculate an earthquake magnitude at a hypocenter distance from the structure site (S342). That is, the calculated refers to a threshold earthquake-resistance magnitude M at which the structure dose not collapse due to the earthquake-resistance. The earthquake-resistance magnitude M may be calculated as follows:

$$M=[CD+CA]/CM \qquad \text{equation 3}$$

where CD refers to a damping value based on a hypocenter distance according to the equation 1, CA refers to a required ground acceleration transformation value according to the equation 2, CM refers to the correction coefficient reflecting ground amplification based on the ground characteristic, wherein the softer the ground is, the larger the ground amplification.

Finally, the earthquake magnitude (S342) may be stored in the memory 130 in FIG. 1 as an earthquake-resistance magnitude 132 (S343). As shown in FIG. 6, the determination may be made about whether to calculate a further earthquake-resistance magnitude M' for a further hypocenter distance L' (S344). Upon determination to calculate the further earthquake-resistance magnitude M', a further seismic epicenter distance assumption value may be input to the input 111 of the interface 110 as shown in FIG. 7 (S312a). Then, the damping coefficient assumption values CD1, CD2, CDn for the further hypocenter distance L' may be input (S321) and, the correction coefficient assumption values CA1, CA2, CAn, CM may be input (S331, S341) as the previous or new assumption values. Then, the processor 120 may store a further calculated earthquake magnitude S343 for the further hypocenter distance L' to the memory 130 as the earthquake-resistance magnitude 132 (S343). The result may be output to the output 112 of the interface 110 as shown in FIG. 8.

Examples of various embodiments are illustrated in the accompanying drawings and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims. Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

What is claimed is:

1. A structure earthquake-resistance design method using a computer, the method comprising:
    receiving first information about a structure at a predetermined site by an input of an interface of the computer and calculating an earthquake-resistance of the structure by a processor of the computer, wherein the first information is related to the earthquake-resistance calculation;
    receiving second information about the structure and a surrounding gourd characteristic by the input of the interface of the computer, calculating an external vibration force by the processor of the computer, wherein the second information is related to the external vibration force calculation, and calculating a required ground acceleration at which the external vibration force matches the earthquake-resistance by the processor; and calculating, by the processor, an earthquake magnitude at a predetermined distance at which the required ground acceleration is available;
    wherein the earthquake-resistance calculation includes: receiving, by the input, an elastic modulus and size of each vertical member at each store of the structure, a number of stores and a height of the structure, and an earthquake importance factor for rigidity calculation for the structure; calculating, by the processor, a total rigidity of all vertical members in the structure using the elastic modulus and size of each vertical member at each store of the structure, and the number of the stores and height of the structure, calculating, by the processor, a structure earthquake-resistance grade and an acceptable inter-store displacement ratio using the earthquake importance factor; calculating, by the processor, an acceptable inter-store displacement by multiplying the acceptable inter-store displacement ratio by the number of the stores and height of the structure; calculating, by the processor, the structure rigidity by multiplying the calculated total rigidity by the acceptable inter-store displacement; receiving, by the input, a damping rate of the structure, and a ground shear wave velocity; calculating, by the processor, a damping ability of the structure by multiplying the damping rate by the ground shear wave velocity; and calculating, by the processor, the structure earthquake-resistance by summing the structure rigidity and structure damping ability.

2. The method of claim 1, wherein the required ground acceleration calculation includes: receiving, by the input, an earthquake importance factor, a height and/or an effective weight of a structure framework earthquake resistance system and a full structure and a ground type; receiving, by the input, a ground acceleration assumption value for the site; processing, by the processor, the earthquake importance factor, the height and/or an effective weight and the ground type to calculate a natural period and short period and one-second period response spectrums of the structure corresponding to the ground acceleration assumption value G'; calculating, by the processor, a structure-designed response spectral acceleration using the calculated natural period and short period and one-second period response spectrums; calculating, by the processor, a required acceleration by summing the ground acceleration assumption value and the calculated structure-designed response spectral acceleration; calculating, by the processor, the external vibration-force by multiplying the required acceleration by the effective weight; determining, by the processor, whether the external vibration-force matches the earthquake-resistance; and determining, by the processor, the required ground acceleration at which the external vibration-force matches the earthquake-resistance.

3. The method of claim 1, wherein the earthquake magnitude calculation includes: receiving, by the input, a focal depth assumption value and a seismic epicenter distance assumption value; calculating, by the processor, a hypocenter distance based on the focal depth assumption value and the seismic epicenter distance assumption value; receiving, by the input, a ground damping coefficient assumption value for the hypocenter distance; calculating, by the processor, a damping value based on the hypocenter distance using the hypocenter distance, and the ground damping coefficient assumption value; receiving, by the input, a correction coefficient assumption value for the required ground acceleration; calculating, by the processor, a required ground acceleration transformation value using the required ground acceleration, and the correction coefficient assumption value; receiving, by the input, a correction coefficient assumption value reflecting ground amplification based on a ground characteristic at the site; and calculating, by the processor, the earthquake magnitude at the distance at which the required ground acceleration is available, wherein the earthquake magnitude is calculated based on the damping value, the transformation value, and the correction coefficient assumption value.

4. The method of claim 3, comprising a further earthquake magnitude calculation including: receiving, by the input, a further focal depth assumption value and a further seismic epicenter distance assumption value; calculating, by the processor, a further hypocenter distance based on the further focal depth assumption value and the further seismic epicenter distance assumption value; receiving, by the input, a further ground damping coefficient assumption value for further the hypocenter distance as a new or previous value; calculating, by the processor, a further damping value based on the further hypocenter distance using the further hypocenter distance, and the further ground damping coefficient assumption value; receiving, by the input, a further correction coefficient assumption value for the required ground acceleration as a new or previous value; calculating, by the processor, a further required ground acceleration transformation value using the required ground acceleration, and the further correction coefficient assumption value; receiving, by the input, a further correction coefficient assumption value reflecting ground amplification for the further hypocenter distance as a new or previous value; and calculating, by the processor, the further earthquake magnitude at the distance at which the required ground acceleration is available, wherein the further earthquake magnitude is calculated based on the further damping value, the further transformation value, and the further correction coefficient assumption value.

* * * * *